(12) United States Patent
Kim et al.

(10) Patent No.: US 7,646,223 B2
(45) Date of Patent: Jan. 12, 2010

(54) PHASE LOCKED LOOP CIRCUIT HAVING SET INITIAL LOCKING LEVEL AND CONTROL METHOD THEREOF

(75) Inventors: Yong-Ju Kim, Gyenoggi-Do (KR); Kun-Woo Park, Gyeonggi-do (KR); Hyung-Soo Kim, Gyeonggi-do (KR); Ic-Su Oh, Gyeonggi-do (KR); Hee-Woong Song, Gyeonggi-do (KR); Jong-Woon Kim, Gyeonggi-do (KR); Tae-Jin Hwang, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 267 days.

(21) Appl. No.: 11/640,965

(22) Filed: Dec. 19, 2006

(65) Prior Publication Data

US 2007/0194818 A1 Aug. 23, 2007

(30) Foreign Application Priority Data

Feb. 22, 2006 (KR) .................... 10-2006-0017172

(51) Int. Cl.
*H03L 7/06* (2006.01)
(52) U.S. Cl. .................. 327/156; 327/147; 375/376; 375/3
(58) Field of Classification Search .......... 327/147, 327/146, 155, 156, 162, 163; 375/375, 376; 341/126, 144
See application file for complete search history.

(56) References Cited

U.S. PATENT DOCUMENTS 4,980,652 A * 12/1990 Tarusawa et al. ............ 331/1 A (Continued)

FOREIGN PATENT DOCUMENTS

JP 1305724 12/1989

(Continued)

OTHER PUBLICATIONS

Vaucher, "An Adaptive PLL Tuning System Architecture Combining High Spectral Purity and Fast Settling Time," IEEE Journal of Solid-State Circuit, vol. 35(4), Apr. 2000, pp. 490-502.

*Primary Examiner*—Hai L Nguyen
(74) *Attorney, Agent, or Firm*—Venable LLP; Jeffri A. Kaminski

(57) ABSTRACT

A phase locked loop circuit and a control method thereof. A phase locked loop circuit includes a phase detecting and correcting block configured to detect a phase difference between a reference clock and a feedback clock, and to correct the phase of the feedback clock such that the phase of the reference clock and the phase of the feedback clock are consistent with each other, and an initial locking level setting block configured to set a locking level in a normal operation mode in the phase detecting and correcting block. The initial locking level setting block includes a digital-to-analog converting unit configured to generate an analog voltage according to a digital code corresponding to the set frequency, and charges the capacitive element with the analog voltage, and a switching unit configured to connect the digital-to-analog converting unit and the capacitive element in response to an input of an operation start signal.

22 Claims, 5 Drawing Sheets

U.S. PATENT DOCUMENTS

| | | | |
|---|---|---|---|
| 5,389,899 A * | 2/1995 | Yahagi et al. | 331/10 |
| 5,963,100 A * | 10/1999 | Tolson et al. | 331/17 |
| 6,229,361 B1 * | 5/2001 | Henwood | 327/145 |
| 6,340,904 B1 | 1/2002 | Manning | |
| 6,396,890 B1 * | 5/2002 | Turner | 375/376 |
| 6,680,874 B1 | 1/2004 | Harrison | |
| 6,912,680 B1 | 6/2005 | Keeth | |
| 6,914,489 B2 | 7/2005 | Charlon | |
| 6,954,097 B2 | 10/2005 | Harrison | |
| 7,016,451 B2 | 3/2006 | Harrison | |
| 7,085,975 B2 | 8/2006 | Manning | |
| 7,095,347 B2 * | 8/2006 | Hirata et al. | 341/144 |
| 7,199,673 B2 * | 4/2007 | Erdogan | 331/17 |
| 7,274,231 B1 * | 9/2007 | Gillespie et al. | 327/158 |

FOREIGN PATENT DOCUMENTS

| | | |
|---|---|---|
| JP | 8288839 | 11/1996 |
| JP | 2001156634 | 6/2001 |
| JP | 2003-081734 | 10/2004 |
| JP | 2004289703 | 10/2004 |

* cited by examiner

PHASE LOCKED LOOP CIRCUIT HAVING SET INITIAL LOCKING LEVEL AND CONTROL METHOD THEREOF

BACKGROUND OF THE INVENTION

1. Technical Field

The present invention relates to a phase locked loop (hereinafter, referred to as PLL) circuit and a control method thereof, in particular, to a phase locked loop circuit that detects and corrects a phase difference between a reference clock and a feedback clock, and to a control method thereof.

2. Related Art

In general, a PLL circuit is a frequency feedback type circuit that generates a signal having a certain frequency in response to the frequency of an input signal. The PLL detects a phase difference between a reference signal and an oscillation signal and performs phase synchronization, such that the oscillation signal has a desired frequency, using an up-down signal according to the detected phase difference. The PLL is used as a clock recovery circuit for a frequency synthesis circuit or a data processing circuit.

Such a PLL circuit performs a phase locking operation on a clock frequency required by a system in a normal system operation mode, and stops the phase locking operation in a mode for minimizing the system power consumption, for example, in a power down mode, thereby reducing the power consumption of the PLL circuit.

When the system, that is, a semiconductor memory to which the PLL circuit is applied, enters the power down mode, the voltage level of a memory element constituting the PLL circuit may drop. For this reason, when the system returns to the normal mode again, the PLL circuit may not remember the previous state, repeat the same processes as those in the normal system operation mode, and perform a phase relocking operation on the clock frequency.

Therefore, since it takes much time for phase locking and relocking of the clock frequency, system performance deteriorates, and power consumption increases.

SUMMARY OF THE INVENTION

An embodiment of the present invention provides a phase locked loop circuit that can improve a locking time and a relocking time of a clock frequency so as to improve system performance, and can reduce power consumption.

Another embodiment of the present invention provides a method of controlling a phase locked-loop.

According to an embodiment of the invention, a phase locked loop circuit includes a phase detecting and correcting block that detects a phase difference between a reference clock and a feedback clock, and corrects the phase of the feedback clock such that the phase of the reference clock and the phase of the feedback clock are consistent with each other; and an initial locking level setting block that sets a locking level in a normal operation mode in the phase detecting and correcting block.

The phase detecting and correcting block may further include a loop filter having a capacitive element, and the initial locking level setting block may store an initial locking level in the loop filter.

The initial locking level setting block may include a digital-to-analog converting unit that generates an analog voltage according to a digital code corresponding to the set frequency, and charges the capacitive element with the analog voltage; and a switching unit that connects the digital-to-analog converting unit and the capacitive element in response to the input of an operation start signal.

The digital-to-analog converting unit may include a first resistor, one end of which is connected to a power terminal, a plurality of switches that are connected in parallel to the other end of the first resistor and are turned on/off according to the digital code, and a plurality of second resistors that are correspondingly connected to the plurality of switches and have different resistance values.

The operation start signal may include a power up signal for a system to which the phase locked loop is applied and a signal indicating that the system has returned from a power down mode to the normal operation mode.

The switching unit may connect the digital-to-analog converting unit and the capacitive element after the operation start signal is enabled and a predetermined time lapses.

The phase locked loop according to this embodiment of the present invention may further include an amplifying unit that amplifies the analog voltage generated by the digital-to-analog converting unit according to a predetermined gain, and outputs the amplified analog voltage to the switching unit.

The amplifying unit may be an OTA (Operational Transconductance Amplifier) having a first input terminal to which an output voltage of the digital-to-analog converting unit is input, an output terminal that is connected to the capacitive element, and a second input terminal to which an output voltage of the output terminal may be feedback.

According to another embodiment of the present invention, a phase locked loop circuit includes a phase detecting and correcting unit that charges or discharges a capacitive element according to a phase difference between a reference clock and a feedback clock, and corrects the phase of the feedback clock using a voltage level of the capacitive element such that the phase of the reference clock and the phase of the feedback clock are consistent with each other; a digital-to-analog converting unit that generates an analog voltage according to a predetermined digital code corresponding to a set frequency; a comparing unit that compares the level of the analog voltage and the voltage level of the capacitive element voltage level and outputs a comparison signal; and a code setting unit that searches the digital code when the level of the analog voltage is consistent with the voltage level of the capacitive element, uses the comparison signal according to a power down signal, and sets the digital code in the digital-to-analog converting unit.

According to another embodiment of the present invention, a phase locked loop circuit includes a phase detecting and correcting unit that charges or discharges a capacitive element according to a phase difference between a reference clock and a feedback clock, and corrects the phase of the feedback clock using the voltage level of the capacitive element such that the phase of the reference clock and the phase of the feedback clock are consistent with each other; a digital-to-analog converting unit that generates an analog voltage according to a predetermined digital code and charges the capacitive element with the analog voltage; a switching unit that connects the digital-to-analog converting unit and the capacitive element in response to an input of an operation start signal; a comparing unit that compares the level of the analog voltage and the voltage level of the capacitive element and outputs a comparison signal; and a code setting unit that searches the digital code when the level of the analog voltage is consistent with the voltage level of the capacitive element, uses the comparison signal according to a power down signal, and sets the digital code in the digital-to-analog converting unit.

According to another aspect of the present invention, there is provided a method of controlling a phase locked loop circuit that includes a phase detecting and correcting unit for charging or discharging a capacitive element according to a phase difference between a reference clock, and a feedback clock and correcting the phase of the feedback clock using the voltage level of the capacitive element such that the phase of the reference clock and the phase of the feedback clock are consistent with each other; a digital-to-analog converting unit; and a switching unit. The method includes converting a digital code corresponding to a prescribed phase locked loop frequency into an analog voltage using the digital-to-analog converting unit, controlling the switching unit according to an operation start signal so as to charge the capacitive element with the analog voltage, and causing the phase detecting and correcting unit to perform phase detection and correction using the voltage level of the capacitive element charged with the analog voltage.

The controlling of the switching unit according to the operation start signal so as to charge the capacitive element with the analog voltage may start after a power up signal of a system to which the phase locked loop is applied, and a signal indicating that the system has returned from a power down mode to a normal operation mode, are enabled, and a predetermined time lapses.

According to another embodiment of the present invention, there is provided a method of controlling a phase locked loop circuit that includes a phase detecting and correcting unit for charging or discharging a capacitive element according to a phase difference between a reference clock and a feedback clock and correcting the phase of the feedback clock using the voltage level of the capacitive element such that the phase of the reference clock and the phase of the feedback clock are consistent with each other; a digital-to-analog converting unit for converting a digital code corresponding to a phase locked loop frequency into an analog voltage; a comparing unit; and a code setting unit. The method includes comparing the level of the analog voltage and the voltage level of the capacitive element, searching the digital code when the level of the analog voltage level is consistent with the voltage level of the capacitive element, and using the result of the voltage level comparison according to a power down signal and setting the digital code in the digital-to-analog converting unit.

According to another embodiment of the present invention, there is provided a method of controlling a phase locked loop circuit that includes a phase detecting and correcting unit for charging or discharging a capacitive element according to the phase difference between a reference clock and a feedback clock and correcting the phase of the feedback clock using the voltage level of the capacitive element such that the phase of the reference clock and the phase of the feedback clock are consistent with each other; a digital-to-analog converting unit for converting a digital code corresponding to a phase locked loop frequency into an analog voltage; a switching unit; a comparing unit, and a code setting unit. The method includes comparing the level of the analog voltage level and the voltage level of the capacitive element, searching the digital code when the level of the analog voltage level is consistent with the voltage level of the capacitive element, using the result of the voltage level comparison according to a power down signal and setting the digital code in the digital-to-analog converting unit, converting a digital code corresponding to a prescribed phase locked loop frequency into an analog voltage using the digital-to-analog converting unit, and controlling the switching unit according to an operation start signal so as to charge the capacitive element with the analog voltage.

DESCRIPTION OF EXEMPLARY EMBODIMENT

Figure 1:
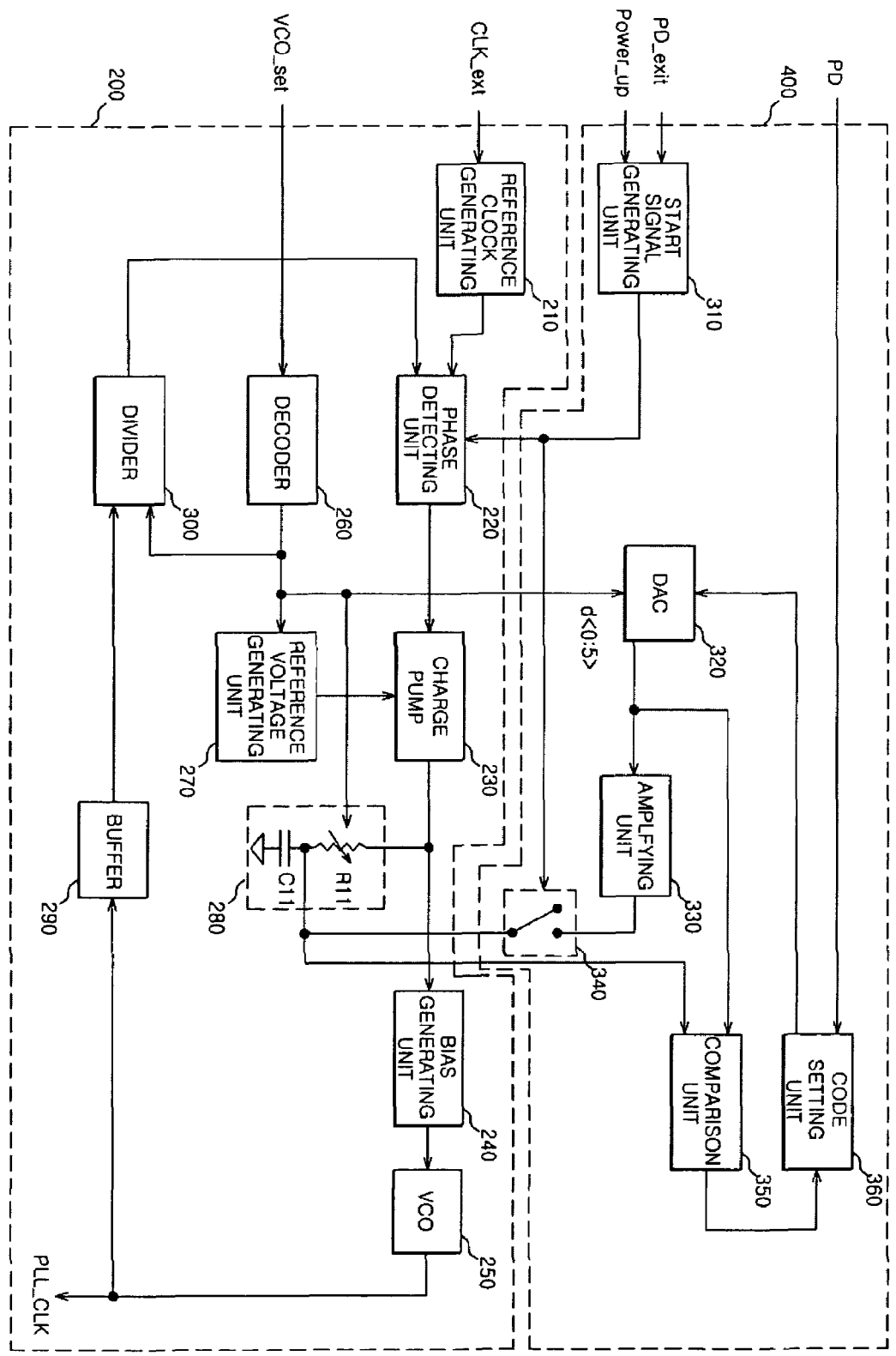
FIG. 1 is a block diagram of a PLL circuit according to an embodiment of the present invention.

An exemplary embodiment of the present invention will now be described with reference to the accompanying drawings. However, the invention may be embodied in many different forms and should not be construed as being limited to the embodiment set forth herein. Rather, the embodiment is provided such that this disclosure will be thorough and complete and will fully convey the concept of the invention to those skilled in the art. In the drawings, the thicknesses of layers and regions are exaggerated for clarity. Like reference numerals refer to like elements throughout the specification.

An embodiment of the present invention provides a PLL circuit having an initial locking level setting block that sets a locking level in a normal operation mode. By setting of the locking level in the normal operation mode, such a PLL circuit provides the locking level of the normal operation mode upon subsequent relocking from a power down mode to the normal operation mode. Accordingly, a time required for relocking the PLL circuit can be significantly reduced, and power consumption can also be significantly reduced.

Hereinafter, such a PLL circuit and a control method thereof will be described in detail.

Referring to FIG. 1, a PLL circuit according to this embodiment broadly includes a phase detecting and correcting block 200 and an initial locking level setting block 400.

The phase detecting and correcting block 200 includes a reference clock generating unit 210, a phase detecting unit 220, a charge pump 230, a bias generating unit 240, a VCO (voltage controlled oscillator) 250, a decoder 260, a reference voltage generating unit 270, a loop filter 280 having a variable resistor R11 and a capacitor C11, a buffer 290, and a divider 300.

The reference clock generating unit 210 receives an external clock CLK_ext and generates a reference clock as a reference for performing locking and relocking operations. The phase detecting unit 220 detects a phase difference signal between the reference clock and a clock feedback from the VCO 250, and outputs the phase difference detection signal for determining drivability of the charge pump 230. The charge pump 230 supplies a current to the loop filter 280 in correspondence with a reference voltage output from the reference voltage generating unit 270 according to the phase difference detection signal. The bias generating unit 240 generates a bias voltage corresponding to a charge amount of the loop filter 280. The VCO 250 generates a clock (hereinafter, referred to as PLL_CLK) having a frequency corresponding to the bias voltage. Meanwhile, the decoder 260 outputs digital codes d<0:5> obtained by decoding prescribed digital frequency data VCO_set, and sets the level of the reference voltage of the reference voltage generating unit 270 and the value of the variable resistor R11 of the loop filter 280. The reference voltage generating unit 270 is formed using BGR (Band Gap Reference) and generates a reference voltage according to a decoding value of the decoder 260. The capacitor C11 of the loop filter 280 is charged with a current supplied from the charge pump 230, and discharges the charged current therein when the current supply from the charge pump 230 stops. The buffer 290 performs buffering of the voltage level of the PLL_CLK to a voltage level to be recognized by a system to which the PLL circuit is applied, that is, a CMOS level. The divider 300 divides the output of the buffer 290 into a frequency for comparison in the phase detecting unit 220, and feeds back the frequency to the phase detecting unit 220.

Meanwhile, the initial locking level setting block 400 includes a start signal generating unit 310, a DAC (Digital to Analog Converter) 320, an amplifying unit 330, a switching unit 340, a comparison unit 350, and a code setting unit 360.

The start signal generating unit 310 generates a pulsed start signal according to a power down end signal (hereinafter, referred to as PD_exit) and a power up signal (hereinafter, referred to as power_up).

Figure 2:
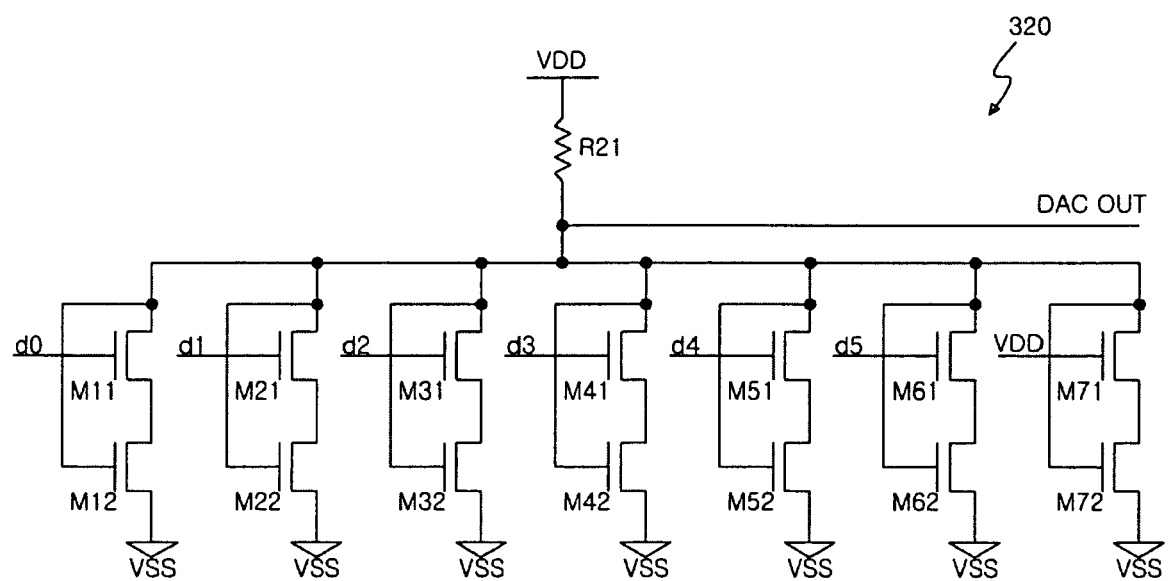
FIG. 2 is an internal circuit diagram of a DAC constituting part of the PLL circuit according to the embodiment of the present invention represented in FIG. 1.

As shown in FIG. 2, the DAC 320 is formed using a 6-bit current sink. In this embodiment, the DAC 320 includes a resistor R21 connected to a power source VDD. The resistor R21 is connected to a plurality of first transistors M11, M21, M31, M41, M51, M61, and M71 that operate by switches turned on/off according to the digital codes d<0:5>. Further, the first transistors M11, M21, M31, M41, M51, M61, and M71 are correspondingly connected to second transistors M12, M22, M32, M42, M52, M62, and M72. The second transistors M12, M22, M32, M42, M52, M62, and M72 have different resistance values, respectively. In this embodiment, the second transistors M12, M22, M32, M42, M52, M62, and M72 may operate as resistive elements. Here, the plurality of first transistors M11, M21, M31, M41, M51, M61, and M71 have gates to which the digital codes d<0:5> are correspondingly input, and drains that are commonly connected to the resistor R21. Further, the plurality of second transistors M12, M22, M32, M42, M52, M62, and M72 have gates, to which a power source VDD is input, drains that are correspondingly connected to sources of the first transistors M11, M21, M31, M41, M51, M61, and M71, and sources that are connected to a ground (VSS).

The DAC 320 may output a prescribed voltage according to the digital codes d<0:5>. That is, if the first transistors M11, M21, M31, M41, M51, M61, and M71 are turned on according to the digital codes d<0:5>, the second transistors M12, M22, M32, M42, M52, M62, and M72 that are correspondingly connected to the first transistors M11, M21, M31, M41, M51, M61, and M71 divide the power source voltage VDD with the resistor R21, and output the divided voltage. Accordingly, the resistance values of the second transistors M12, M22, M32, M42, M52, M62, and M72 are determined on the basis of the voltage level set in the DAC 320.

Figure 3:
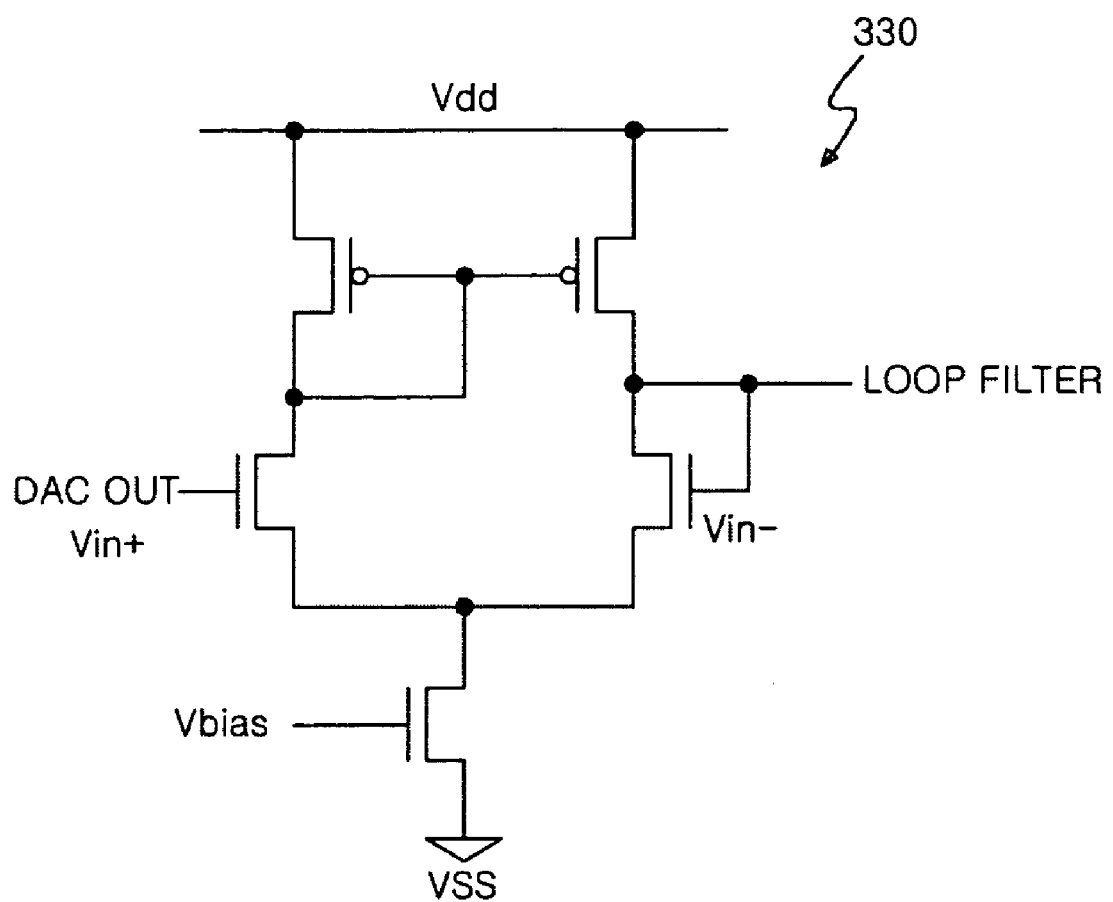
FIG. 3 is an internal circuit diagram of an amplifying unit constituting part of the PLL circuit according to the embodiment of the present invention represented in FIGS. 1 and 2.

Referring to in FIG. 3, the amplifying unit 330 may be an OTA (Operational Transconductance Amplifier) that has a first input Vin+ and a second input Vin−. In this embodiment, the output voltage of the DAC 320 is input to the first input Vin+ of the amplifying unit 330, and the output signal of the amplifying unit 330 connected to the loop filter 280 is fed back to the second input Vin− thereof. The amplifying unit 330 amplifies the output voltage of the DAC 320, and charges the loop filter 280 with the amplified voltage through the switching unit 340. At this time, as the gain of the amplifying unit 330 gets larger, the charging time of the loop filter 280 is delayed. Accordingly, in order to reduce the charging time, the amplifying unit 330 needs to be designed to have an appropriate gain.

The switching unit 340 is turned on during an enable period of the start signal output from the start signal generating unit 310, such that the output of the amplifying unit 330 is supplied to the loop filter 280.

The comparison unit 350 compares the level of the DAC 320 output voltage and the level of the loop filter 280 charging voltage and outputs a comparison signal between the level of the output voltage of DAC 320 and the level of the charging voltage of the loop filter 280.

The code setting unit 360 may have a binary search finite state machine (FSM). The code setting unit 360 performs binary searching within a set range determined according to the output of the comparison unit 350 such that the output voltage of the DAC 320 and the level of the output voltage of the loop filter 280 are consistent with each other, to update the level of the output voltage of the DAC 320. For example, a state change for binary searching in the code setting unit 360 may be performed by a method shown in FIG. 4. On an assumption that a target code value to be set in the DAC 320 in order to output the same voltage level as the voltage level of the loop filter 280 is 1010, and code values set in the code setting unit 360 are 0001 to 1111, the operation of the code setting unit 360 will be described with reference to FIG. 4. Of course, it is configured such that, as the code value increases, the level of the output voltage of the DAC 320 also increases.

The code setting unit 360 is configured to select an average value among the set code values upon an initial operation. For example, if the code value 1000 is output to the DAC 320 by the decoder 260, the DAC 320 outputs a voltage according to the code value 1000, and the comparison unit 350 outputs a signal (for example, low) indicating that the output voltage of the DAC 320 is lower than the output voltage of the loop filter 280 output voltage. If the code setting unit 360 selects code value 1100 to the DAC 320 as an average code value of 1100 between the maximum code value 1111 and the code value 1000, the comparison unit 350 outputs a signal (for example, high) indicating that the output voltage of the DAC 320 is higher than the output voltage of the loop filter 280. Accordingly, the code setting unit 360 searches an average code value of 1010 between the code value 1000 and the code value 1100, and completes the searching operation.

The operation of the phase locked loop circuit having this configuration will now be described below. In this description, on an assumption that the system to which the phase locked loop circuit is applied is a semiconductor memory, there is a locking operation in the normal operation mode of the semiconductor memory and a relocking operation when the semiconductor memory returns from the power down mode to the normal operation mode.

First, the locking operation in the normal operation mode of the semiconductor memory will be described.

The normal operation mode of the semiconductor memory starts as the power up signal (hereinafter, referred to as Power_up) indicating that the level of a power source is stabilized, is enabled. If the Power_up signal is enabled, the decoder 260 decodes prescribed frequency data VCO_set. According to the digital codes d<0:5> output from the decoder 260, the level of the reference voltage of the reference voltage generating unit 270, the value of the variable resistor R11 of the loop filter 280, and a division ratio of the divider 300 are set.

The DAC 320 outputs a voltage corresponding to each of the digital codes d<0:5> to the amplifying unit 330, and the amplifying unit 330 amplifies the output voltage of the DAC 320. The voltage amplified by the amplifying unit 330 is charged in the capacitor C11 of the loop filter 280 using the switching unit 340, and then an initial locking level is set.

Meanwhile, the start signal generating unit 310 enables the start signal after the Power_up is enabled and a predetermined time elapses.

After the predetermined time elapses, the switching unit 340 is turned on by the start signal output from the start signal generating unit 310, and connects the amplifying unit 330 and the loop filter 280.

Further, according to the initial locking level set in the loop filter 280, the bias generating unit 240 generates a predetermined bias voltage, and the VCO 250 outputs the PLL_CLK according to the level of the bias voltage.

Then, the PLL_CLK signal is fed back to the phase detecting unit 220 through the buffer 290 and the divider 300, and the phase detecting unit 220 repeats the phase detection and correction process using the feedback value, thereby performing the locking operation.

According to this embodiment, after the initial locking level is set, the locking operation is performed. Accordingly, a phase difference where phase detection and correction is actually performed is markedly reduced, compared with the related art. As a result, the locking operation can be rapidly performed.

The relocking operation when the semiconductor memory returns from the power down mode to the normal operation mode will now be described.

If the semiconductor memory enters the power down mode, a power down mode entry signal (hereinafter, referred to as PD) is enabled. If the PD is enabled, for a predetermined time before the PLL is completely powered down, the code setting unit 360 updates the digital code d<0:5> for determining the level of the output voltage of the DAC 320 using the output of the comparing unit 350.

That is, the level of the output voltage of the DAC 320 is used to set the initial locking level in the normal operation mode before than power down, and is not consistent with the level of the charging voltage of the loop filter 280 that is adjusted according to subsequent phase difference detection and correction.

Figure 4:
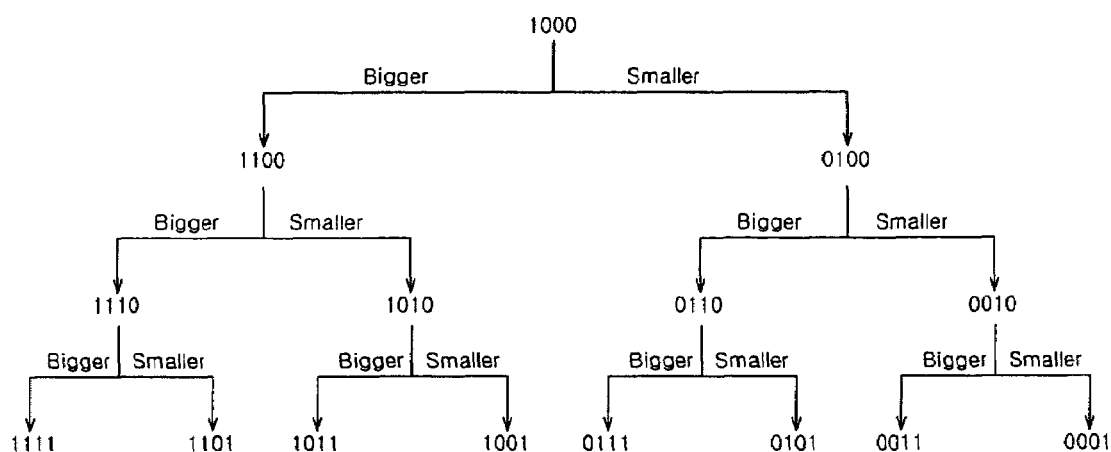
FIG. 4 is a flowchart illustrating the operation of a code setting unit constituting part of the PLL circuit according to an embodiment of the present invention.

The code setting unit 360 repeats the operation of searching a digital code according to the output of the comparison unit 350 by the method described with reference to FIG. 4. Accordingly, if it is determined that the level of the output voltage of the DAC 320 is consistent with the level of the charging voltage of the loop filter 280 or is approximately to the level of the charging voltage of the loop filter 280 within an acceptable error range, the code setting unit 360 stores the digital code therein or in the DAC 320 and ends the digital code update operations. At this time, the code setting unit 360 stores the latest updated digital code because power may be cut off when the DAC 320 is in the power down mode, and data may be lost. Of course, in this case, the code setting unit 360 may be supplied with power in the power down mode.

After the digital code update is completed, the PLL is powered down.

In the power down period, the loop filter 280 is not supplied with a current through the charge pump 230, and thus the level of the charging voltage may drop. Then, if the power down end signal PD_exit is enabled, the start signal generating unit 310 enables the pulsed start signal after a predetermined time lapses.

For the predetermined time, the decoder 260 decodes the prescribed frequency data VCO_set and outputs the digital codes d<0:5>. Then, according to the digital codes d<0:5>, the level of the reference voltage of the reference voltage generating unit 270, the value of the variable resistor R11 of the loop filter 280, and the division ratio of the divider 300 are set.

The switching unit 340 is turned on by the start signal output from the start signal generating unit 310 and connects the amplifying unit 330 and the loop filter 280. Accordingly, the DAC 320 outputs a voltage according to the updated digital code.

The amplifying unit 330 amplifies the voltage output from the DAC 320, and charges the capacitor C11 of the loop filter 280 with the amplified voltage through the switching unit 340, such that the charging voltage of the loop filter 280 is set to the initial locking level.

Next, the bias generating unit 240 generates a predetermined bias voltage according to the charging voltage of the loop filter 280, and the VCO 250 outputs the PLL_CLK according to the level of the bias voltage.

The PLL_CLK is fed back to the phase detecting unit 220 through the buffer 290 and the divider 300, and the phase detecting unit 220 repeats the phase detection operation and correction operation using the feedback value, thereby performing the locking operation.

In this embodiment of the present invention, in the power down mode, the update operation for setting the initial locking level and the operation of setting the initial locking level upon the return to the normal mode are performed. Therefore, a phase difference where phase detection and correction is actually performed is significantly reduced, such that the relocking operation is rapidly performed.

Figure 5:
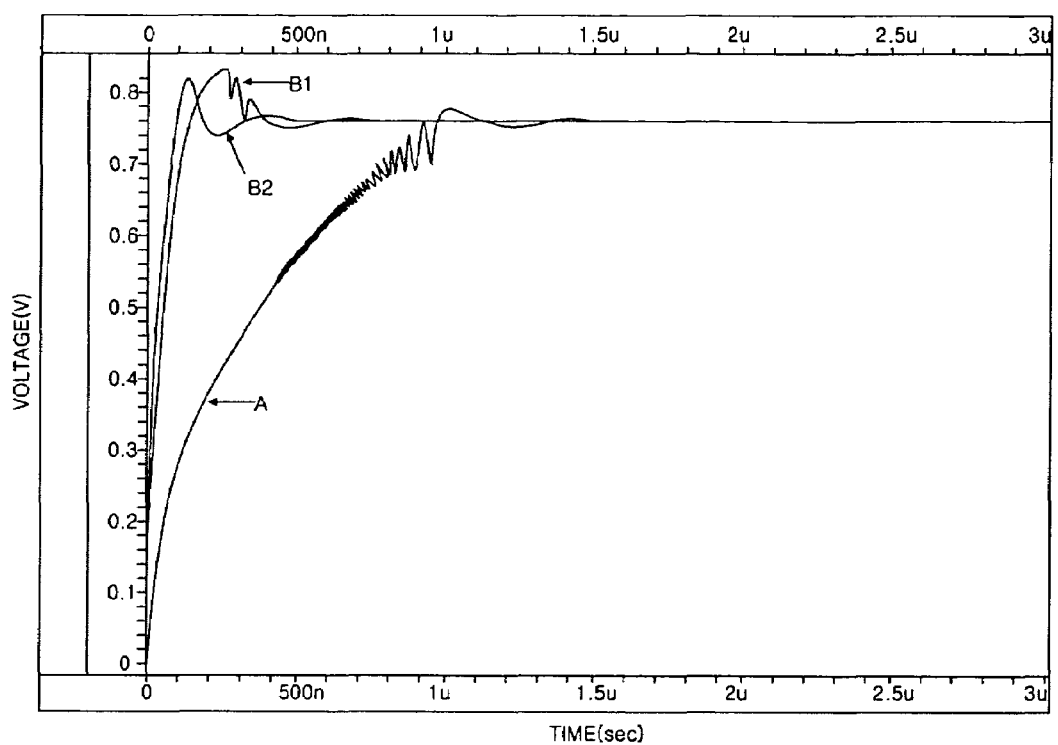
FIG. 5 is a waveform illustrating the result of a simulation of a locking time and a relocking time of the PLL circuit according to an embodiment of the present invention.

FIG. 5 is a waveform illustrating the result of a simulation of a locking time and a relocking time of the phase locked loop circuit according to an embodiment of the present invention.

Referring to FIG. 5, the time required for locking and relocking (A) of a general phase locked loop circuit (A) is approximately 1.5 μS. Meanwhile, phase locked loop circuit having the initial locking level setting unit, like this embodiment of the present invention, has a locking time (B1) of approximately 800 ns and a relocking time (B2) of approximately 600 ns. According to this measurement, it can be seen that the phase locked loop of the invention can reduce the time required for locking and relocking to a third of the known phase locked loop.

In this embodiment, the initial locking level setting block includes the start signal generating unit 310, the DAC 320, and the switching unit 340, but the present invention is not limited thereto. Any circuit configuration may be included insofar as it can set the locking level in the normal mode operation.

It will be apparent to those skilled in the art that various modifications and changes may be made without departing from the scope and spirit of the invention. Therefore, it should be understood that the above embodiment is not limiting, but illustrative in all aspects. The scope of the invention is defined by the appended claims rather than by the description preceding them, and therefore all changes and modifications that fall within metes and bounds of the claims, or equivalents of such the metes and bounds are therefore intended to be embraced by the claims.

The phase locked loop circuit according to an embodiment of the invention includes a block for setting the initial locking level in the normal operation mode. Accordingly, when the system returns from the power down mode to the normal operation mode, all the operations for locking do not need to be repeatedly performed owing to the initial locking level set by the initial locking level setting block, and thus the locking and relocking time can be reduced.

Further, since rapid locking and relocking of the phase of the clock frequency can be realized, an increase in power consumption due to an increase in locking time can be prevented, and power consumption of the PLL circuit itself can be minimized.

What is claimed is:

1. A phase locked loop circuit comprising:
   a capacitive element having a voltage level;
   a phase detecting and correcting unit configured to charge or discharge the capacitive element according to a phase difference between a phase of a reference clock and a phase of a feedback clock, and to correct the phase of the feedback clock using the voltage level of the capacitive element such that the phase of the reference clock and the phase of the feedback clock are synchronized with each other;
   a digital-to-analog converting unit configured to generate an analog voltage having a level according to a predetermined digital code and to charge the capacitive element with the analog voltage;
   a switching unit configured to connect the digital-to-analog converting unit and the capacitive element in response to an input of an operation start signal;
   a comparing unit configured to compare the level of the analog voltage and the voltage level of the capacitive element and to output a comparison signal; and
   a code setting unit configured to search the digital code when the level of the analog voltage is consistent with the voltage level of the capacitive element, using the comparison signal according to a power down signal, and to set the digital code in the digital-to-analog converting unit.

2. The phase locked loop circuit of claim 1,
   wherein, after the power down signal is enabled and setting of the digital code in the code setting unit is completed, the phase locked loop enters a power down mode.

3. A phase locked loop circuit comprising:
   a phase detecting and correcting block including a loop filter with a capacitive element and configured to detect a phase difference between a phase of a reference clock and a phase of a feedback clock, and configured to correct the phase of the feedback clock such that the phase of the reference clock and the phase of the feedback clock are synchronized with each other; and
   an initial locking level setting block configured to set a locking level in a normal operation mode in the phase detecting and correcting block,
   wherein the initial locking level setting block includes
   a digital-to-analog converting unit configured to generate an output as an analog voltage according to a digital code corresponding to a set frequency, and a code setting unit configured to search the digital code when a level of the analog voltage is consistent with a voltage level of the capacitive element using a comparison signal and to set the digital code.

4. The phase locked loop circuit of claim 3,
   wherein the initial locking level setting block selectively charges the capacitive element of the loop filter with an initial locking level.

5. The phase locked loop circuit of claim 3,
   wherein the digital-to-analog converting unit includes:
   a first resistor having a first end connected to a power terminal and a second end;
   a plurality of switches that are connected in parallel to the second end of the first resistor and that are turned on/off according to the digital code;
   a plurality of second resistors correspondingly connected to the plurality of switches and have different resistance values.

6. The phase locked loop circuit of claim 5,
   wherein the plurality of switches comprise transistors respectively having drains connected in common to the second end of the first resistor, and gates to which the digital code is input.

7. The phase locked loop circuit of claim 5,
   wherein the plurality of second resistors comprise transistors respectively having drains respectively connected to one of the plurality of switches, gates connected in common to the power terminal, and sources connected to a ground.

8. The phase locked loop circuit of claim 3,
   wherein the initial locking level setting block includes:
   a switching unit configured to connect the digital-to-analog converting unit and the capacitive element in response to an input of an operation start signal.

9. The phase locked loop circuit of claim 8,
   wherein the switching unit is configured to connect the digital-to-analog converting unit and the capacitive element after the operation start signal is enabled and a predetermined time elapses.

10. The phase locked loop circuit of claim 8, further comprising:
    an amplifying unit configured to amplify the analog voltage generated by the digital-to-analog converting unit according to a predetermined gain and to output the amplified analog voltage to the switching unit.

11. The phase locked loop circuit of claim 10,
    wherein the amplifying unit is an operational transconductance amplifier having a first input terminal to which the output of the digital-to-analog converting unit is input, an output terminal connected to the capacitive element, and a second input terminal to which an output voltage of the output terminal is fed back.

12. The phase locked loop circuit of claim 8,
    wherein the operation start signal includes a power up signal of a system to which the phase locked loop circuit is applied and a signal indicating that the system has returned from a power down mode to the normal operation mode.

13. A phase locked loop circuit comprising:
    a capacitive element having a voltage level;
    a phase detecting and correcting unit configured to charge or discharge the capacitive element according to a phase difference between a phase of a reference clock and a phase of a feedback clock, and to correct the phase of the feedback clock using the voltage level of the capacitive element such that the phase of the reference clock and the phase of the feedback clock are synchronized with each other;
    a digital-to-analog converting unit configured to generate an analog voltage according to a predetermined digital code corresponding to a set frequency;
    a comparing unit configured to compare a level of the analog voltage and the voltage level of the capacitive element and to output a comparison signal; and
    a code setting unit configured to search the digital code when the level of the analog voltage is consistent with the voltage level of the capacitive element, using the comparison signal according to a power down signal, and to set the digital code in the digital-to-analog converting unit.

14. The phase locked loop circuit of claim 13, wherein the capacitive element comprises a loop filter.

15. The phase locked loop circuit of claim 13, wherein the code setting unit comprises a binary search finite state machine.

16. A method of controlling a phase locked loop circuit that includes a phase detecting and correcting unit configured to charge or discharge a capacitive element according to a phase difference between a phase of a reference clock and a phase of a feedback clock and correcting the phase of the feedback clock using a voltage level of the capacitive element such that the phase of the reference clock and the phase of the feedback clock are synchronized with each other, a digital-to-analog converting unit configured to convert a digital code corresponding to a phase locked loop frequency into an analog voltage, a comparing unit, and a code setting unit, the method comprising:

comparing the level of the analog voltage and the voltage level of the capacitive element; and searching the digital code when the level of the analog voltage level is consistent with the voltage level of the capacitive element using a result of the comparing of the voltage levels according to a power down signal, and setting the digital code in the digital-to-analog converting unit.

17. The method of claim 16, wherein the searching of the digital code when the level of the analog voltage is consistent with the voltage level of the capacitive element using the comparison result of the voltage levels, and the setting of the digital code in the digital-to-analog converting unit includes:

inputting a plurality of digital codes to the digital-to-analog converting unit and checking the result of the of the comparing of the voltage levels according to the plurality of digital codes; and setting the digital code in the digital-to-analog converting unit using the result of the comparing of the voltage levels, in case the level of the analog voltage is consistent with the voltage level of the capacitive element.

18. The method of claim 16, wherein, if the searching and setting of the digital code is completed, the phase locked loop circuit enters a power down mode.

19. A method of controlling a phase locked loop circuit that includes a phase detecting and correcting unit configured to charge or discharge a capacitive element according to a phase difference between a phase of a reference clock and a phase of a feedback clock and correcting the phase of the feedback clock using a voltage level of the capacitive element such that the phase of the reference clock and the phase of the feedback clock are synchronized with each other, a digital-to-analog converting unit configured to convert a digital code corresponding to a phase locked loop frequency into an analog voltage, a switching unit, a comparing unit, and a code setting unit, the method comprising:

comparing the level of the analog voltage and the voltage level of the capacitive element;

searching the digital code when the level of the analog voltage level is consistent with the voltage level of the capacitive element using a result of the comparing of the voltage levels according to a power down signal, and setting the digital code in the digital-to-analog converting unit;

converting a digital code corresponding to a prescribed phase locked loop frequency into an analog voltage using the digital-to-analog converting unit; and controlling the switching unit according to an operation start signal so as to charge the capacitive element with the analog voltage.

20. The method of claim 19, wherein the searching of the digital code when the level of the analog voltage is consistent with the voltage level of the capacitive element, using the result of the comparing of the voltage levels, and the setting of the digital code in the digital-to-analog converting unit includes:

inputting a plurality of digital codes to the digital-to-analog converting unit and checking the result of the comparing of the voltage levels according to the plurality of digital codes; and setting the digital code in the digital-to-analog converting unit as the result of the comparing of the voltage levels, in case the level of the analog voltage is consistent with the voltage level of the capacitive element.

21. The method of claim 19, wherein, if the searching and setting of the digital code is completed, the phase locked loop circuit enters a power down mode.

22. The method of claim 21, wherein the controlling of the switching unit according to the operation start signal so as to charge the capacitive element with the analog voltage starts after a power up signal of a system, to which the phase locked loop circuit is applied, and a signal indicating that the system has returned from the power down mode to a normal operation mode are enabled and a predetermined time elapses.

* * * * *